(12) United States Patent
Ranish et al.

(10) Patent No.: US 8,698,049 B2
(45) Date of Patent: *Apr. 15, 2014

(54) RAPID THERMAL PROCESSING LAMPHEAD WITH IMPROVED COOLING

(71) Applicant: Applied Materials, Inc., Santa Clara, CA (US)

(72) Inventors: Joseph M. Ranish, San Jose, CA (US); Khurshed Sorabji, San Jose, CA (US); Kedarnath Sangam, Sunnyvale, CA (US); Alexander Lerner, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/657,935

(22) Filed: Oct. 23, 2012

(65) Prior Publication Data

US 2013/0044493 A1 Feb. 21, 2013

Related U.S. Application Data

(63) Continuation of application No. 12/207,711, filed on Sep. 10, 2008, now Pat. No. 8,294,068.

(51) Int. Cl.
*A21B 1/00* (2006.01)
*F21V 29/00* (2006.01)

(52) U.S. Cl.
USPC ........... 219/395; 219/390; 219/405; 219/411; 392/416; 392/418; 118/724; 118/725; 118/50.1; 362/294

(58) Field of Classification Search
USPC .......... 219/390, 405, 411, 395; 392/416, 418; 118/724, 725, 50.1; 362/294
See application file for complete search history.

(56) References Cited

U.S. PATENT DOCUMENTS

| 5,446,825 A | 8/1995 | Moslehi et al. |
| 5,683,173 A | 11/1997 | Gronet et al. |

(Continued)

FOREIGN PATENT DOCUMENTS

| JP | 03-116828 A | 5/1991 |
| JP | 08-031755 A | 2/1996 |

(Continued)

OTHER PUBLICATIONS

Extended European Search Report dated Nov. 14, 2012 for EP Application No. 09813523.9.

(Continued)

*Primary Examiner* — Shawntina Fuqua
(74) *Attorney, Agent, or Firm* — Moser Taboada; Alan Taboada

(57) ABSTRACT

Embodiments of a lamphead and apparatus utilizing same are provided. In some embodiments, a lamphead for thermal processing may include a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and at least one heat transfer member extending from the monolithic member into each coolant passage, wherein the at least one heat transfer member extends into each coolant passage up to the full height of each coolant passage. The lamphead may be disposed in an apparatus comprising a process chamber having a substrate support, wherein the lamphead is positioned to provide energy to the substrate support.

20 Claims, 5 Drawing Sheets

(56) References Cited

U.S. PATENT DOCUMENTS

| | | |
|---|---|---|
| 5,892,886 A | 4/1999 | Sandhu |
| 6,106,737 A | 8/2000 | Tomoyasu et al. |
| 6,350,964 B1 | 2/2002 | Boas et al. |
| 6,423,178 B1 | 7/2002 | Ohmi et al. |
| 6,805,466 B1 | 10/2004 | Ranish |
| 6,951,587 B1 | 10/2005 | Narushima |
| 7,355,715 B2 | 4/2008 | Suzuki et al. |
| 2003/0159307 A1 | 8/2003 | Sago et al. |
| 2004/0206477 A1 | 10/2004 | Kenny et al. |
| 2006/0098963 A1 | 5/2006 | Shimizu et al. |
| 2006/0211248 A1 | 9/2006 | Brabant et al. |
| 2006/0223315 A1 | 10/2006 | Yokota et al. |
| 2008/0302513 A1 | 12/2008 | Eibl |

FOREIGN PATENT DOCUMENTS

| | | |
|---|---|---|
| JP | 2002-208466 A | 7/2002 |
| JP | 2008-116199 A | 5/2008 |
| WO | WO 2004/073050 A1 | 8/2004 |

OTHER PUBLICATIONS

International Search Report and Written Opinion mailed Feb. 17, 2010 for PCT Application No. PCT/US2009/056340.

US 8,698,049 B2

RAPID THERMAL PROCESSING LAMPHEAD WITH IMPROVED COOLING

CROSS-REFERENCE TO RELATED APPLICATIONS

This application is a continuation of co-pending U.S. patent application Ser. No. 12/207,711, filed Sep. 10, 2008, which is herein incorporated by reference.

FIELD

Embodiments of the present invention generally relate to the field of semiconductor processing and more particularly, to an improved lamphead for improving heat removal rates and heat transfer efficiencies within a processing chamber.

BACKGROUND

As the critical dimensions of semiconductor device features continue to shrink, more stringent constraints on thermal budgets are required. For example, a rapid thermal process (RTP) may be required to deliver a short duration high temperature pulse uniformly to a substrate being processed. One example of one apparatus suitable for performing such RTP processes is described in U.S. Pat. No. 6,805,466, issued to Joseph M. Ranish and assigned to Applied Materials, Inc. In the apparatus of the aforementioned patent, coolant passages are disposed proximate a lamphead heat source to facilitate the rapid cooling thereof by flowing a coolant therethrough. While the above-described apparatus is an improvement over the prior art, further improvement may be made to facilitate even more efficient heat removal, thereby facilitating longer life of the apparatus.

SUMMARY

Embodiments of a lamphead and apparatus using the same are provided herein. In some embodiments, a lamphead for use in thermal processing may include a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and at least one heat transfer member extending from the monolithic member into each coolant passage, wherein the at least one heat transfer member extends into each coolant passage up to the full height of each coolant passage.

In some embodiments, a lamphead for use in thermal processing may include a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and at least one heat transfer member extending from the monolithic member into each coolant passage, wherein the at least one heat transfer member is integrally formed in the monolithic member and extends into each coolant passage the full height of each coolant passage.

In some embodiments, an apparatus for use in thermal processing may include a process chamber having a substrate support; and a lamphead positioned to provide energy to the substrate support, the lamphead including a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and at least one heat transfer member extending from the monolithic member into each coolant passage, wherein the at least one heat transfer member extends into each coolant passage up to the full height of each coolant passage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
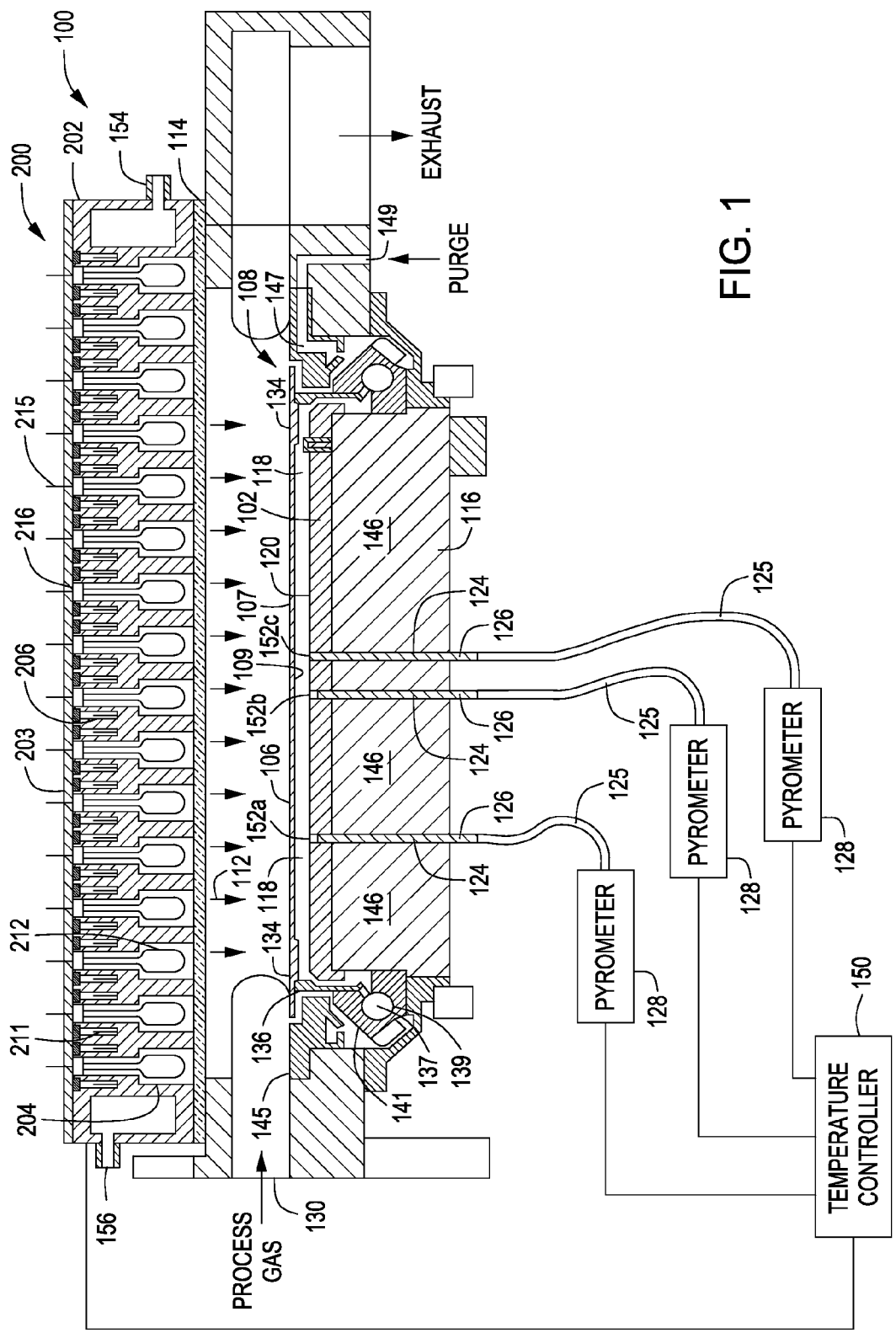
FIG. 1 is a schematic side view of an apparatus in accordance with some embodiments of the present invention.

The drawings have been simplified for clarity and are not drawn to scale. To facilitate understanding, identical reference numerals have been used, wherever possible, to designate identical elements that are common to the figures. It is contemplated that some elements of one embodiment may be beneficially incorporated in other embodiments.

DETAILED DESCRIPTION

Embodiments of a lamphead having improved cooling efficiency and apparatus for processing substrates utilizing the improved lamphead are provided herein. In some embodiments, the lamphead includes a monolithic member having a plurality of coolant passages disposed therein. At least one heat transfer member extends from the monolithic member into each coolant passage. The at least one heat transfer member disposed in each coolant passage may advantageously facilitate the rapid cooling of the monolithic member during a rapid thermal process (RTP), and may further limit cyclical fatigue cracking in the coolant passages. In some embodiments, the lamphead is disposed in an apparatus comprising a process chamber having a substrate support for supporting a substrate disposed therein, wherein the lamphead is disposed in a position opposing the support to facilitate heating the substrate during processing.

In the following description, the term substrate is intended to broadly cover any object that is being processed in a thermal process chamber and the temperature of the substrate is being measured during processing. The term substrate may include, for example, semiconductor wafers, flat panel displays, glass plates or disks, plastic workpieces, and the like.

FIG. 1 depicts a rapid thermal processing system (RTP) in accordance with some embodiments of the present invention. The RTP system may include a processing chamber 100 having a lamphead 200 for processing a substrate 106. In some embodiments, the substrate 106 may be, for example, a disk-shaped, eight inch (200 mm) or twelve inch (300 mm) diameter silicon substrate. The substrate 106 is mounted inside the chamber 100 on a substrate support 108 and is heated by the lamphead 200, which is disposed in a position opposing the substrate support 108. The lamphead 200 generates radiation 112 which is directed to a front side of the substrate 106. Alternatively (not shown), the lamphead 200 may be configured to heat the back side of the substrate 106, for example, such as by being disposed below the substrate 106, or by directing radiation to the back side of the substrate 106. The radiation enters the processing chamber 100 through a water-cooled quartz window assembly 114. Beneath the substrate 106 is a reflector 102, which is mounted on a water-cooled, stainless steel base 116. The base 116 includes a circulation circuit 146 through which coolant circulate to cool the reflector 102. In some embodiments, the reflector 102 is made of aluminum and has a highly reflective surface coating 120. Water, which may be above 23 degrees Celsius, may be circulated through the base 116 to keep the temperature of the reflector 102 well below that of the heated substrate 106. Alternatively, other coolants may be provided at the same or different temperatures. For example, antifreeze or other heat transfer fluids may be circulated through the base 116 and/or the base 116 may be coupled to a chiller (not shown). An underside or backside 109 of the substrate 106 and the top of the reflector 102 form a reflecting cavity 118. The reflecting cavity 118 enhances the effective emissivity of the substrate 106.

In some embodiments, the separation between the substrate 106 and the reflector 102 may be approximately 0.3 of an inch (7.6 mm), thus forming the reflecting cavity 118 which has a width-to-height ratio of about 27. In processing systems that are designed for eight-inch silicon wafers, the distance between the substrate 106 and the reflector 102 is about 3-9 mm. The width-to-height ratio of the cavity 118 should be larger than about 20:1. If the separation is made too large, the emissivity-enhancement effect that is attributable to the virtual blackbody cavity that is formed will decrease. If the separation is too small, for example less than about 3 mm, then the thermal conduction from the substrate 106 to the reflector 102 will increase, thereby imposing a large thermal load on the heated substrate 106, since the main mechanism for heat loss to the reflecting plate will be conduction through the gas. The thermal loading will depend upon the type of process gas and the chamber pressure during processing.

The temperatures at localized regions of the substrate 106 are measured by a plurality of temperature probes, such as 152a, 152b, and 152c. Each temperature probe includes a sapphire light pipe 126 that passes through a conduit 124 that extends from the backside of the base 116 through the top of the reflector 102. In some embodiments, the sapphire light pipe 126 is about 0.125 inch in diameter and the conduit 124 is slightly larger. The sapphire light pipe 126 is positioned within the conduit 124 so that its uppermost end is flush with or slightly below the upper surface of the reflector 102. The other end of light pipe 126 couples to a flexible optical fiber that transmits sampled light from the reflecting cavity 118 to a pyrometer 128.

The pyrometer 128 is connected to a temperature controller 150 which controls the power supplied to the lamphead 200 in response to a measured temperature. In some embodiments, such as for a 200 mm wafer, the lamphead 200 may use 187 lights to deliver highly collimated radiation from tungsten-halogen lamps to the processing chamber 100. In some embodiments, such as for a 300 mm wafer, the lamphead 200 may use 409 lights. The number and configuration of the lights disclosed herein are exemplary and other numbers and configurations may also suitably be used.

The lamps may be divided into multiple zones. The zones can be individually adjusted by the controller to allow controlled radiative heating of different areas of the substrate 106. Such a control system is described in U.S. Pat. No. 5,755,511, assigned to the assignee of the present invention, the entire disclosure of which is incorporated herein by reference.

As indicated above, the described embodiments use measurement or temperature probes distributed over the reflector 102 so as to measure the temperature at different radii of the substrate 106. During thermal processing, the substrate 106 is rotated, for example, at about 90 RPM. Thus, each probe actually samples the temperature profile of a corresponding annular ring area on the substrate 106.

The substrate support 108 which rotates the substrate 106 includes a support or an edge ring 134 which contacts the substrate 106 around the substrate's outer perimeter, thereby leaving the entire underside of the substrate 106 exposed except for a small annular region about the outer perimeter. The support ring 134 is also known as the edge ring 134 and these two terms can be interchangeably used within the specification. In some embodiment, the support ring 134 has a radial width of approximately one inch (2.5 centimeters (cm)). To minimize the thermal discontinuities that will occur at the edge of the substrate 106 during processing, the support ring 134 is made of the same, or similar, material as that of the substrate 106, for example, silicon or silicon carbide.

The support ring 134 rests on a rotatable tubular quartz cylinder 136 that is coated with silicon to render it opaque in the frequency range of the pyrometer 128. The silicon coating on the quartz cylinder 136 acts as a baffle to block out radiation from the external sources that might contaminate the intensity measurements. The bottom of the quartz cylinder 136 is held by an annular upper bearing 141 which rests on a plurality of ball bearings 137 that are, in turn, held within a stationary, annular, lower bearing race 139. In some embodiments, the ball bearings 137 are made of steel and coated with silicon nitride to reduce particulate formation during operations. The upper bearing 141 is magnetically coupled to an actuator (not shown) which rotates the cylinder 136, the edge ring 134 and the substrate 106 during the thermal processing.

A purge ring 145, which is fitted into the chamber body, surrounds the quartz cylinder 136. In some embodiment, the purge ring 145 has an internal annular cavity 147 which opens up to a region above the upper bearing 141. The internal cavity 147 is connected to a gas supply (not shown) through a passageway 149. During processing, a purge gas is flowed into the chamber through the purge ring 145.

In some embodiments, the support ring 134 has an outer radius that is larger than the radius of the quartz cylinder 136 so that it extends out beyond the quartz cylinder 136. The annular extension of the support ring 134 beyond the cylinder 136, in cooperation with the purge ring 145 located below it, functions as a baffle which prevents stray light from entering the reflecting cavity 118 at the backside of the substrate 106. To further reduce the possibility of stray light reflecting into the reflecting cavity 118, the support ring 134 and the purge ring 145 may also be coated with a material (for example, a black or gray material) that absorbs the radiation generated by the heating element 202.

During processing, a process gas can be introduced into the space between the substrate 106 and the window assembly through an inlet port. Gases are exhausted through an exhaust port, which is coupled to a vacuum pump (not shown).

The lamphead 200 is illustrated with the RTP chamber in FIG. 1, and in an enlarged view in FIG. 2. The lamphead 200 includes a monolithic member 202 having a plurality of coolant passages 206 and a plurality of lamp passages 208 and reflector cavities 204 formed therein, and at least one heat transfer member 211 extending from the monolithic member 202 into each coolant passage 206. A plurality of lamp receptacles 214 are coupled to the monolithic member 202, where each lamp receptacle 214 is adapted to conform to the base of a lamp 212 and each reflector cavity 204 is shaped to act as a reflector for the lamp 212. In some embodiments, the reflector cavity 204 may be shaped to receive a replaceable reflective piece (not shown) to act as a reflector for the lamp 212. In some embodiments, each lamp receptacle 214 may be coupled to each reflector cavity 204 via the lamp passage 208.

The monolithic member 202 may be formed from materials having high thermal conductivity. In some embodiments, materials may include at least one of stainless steel, copper, or aluminum. The thermal conductivity of such materials may be about 10-1000 W/mK. In some embodiments, the monolithic member is formed from copper, having thermal conductivity of about 400 W/mK. In some embodiments, the monolithic member 202 may be substantially circular in shape. The monolithic design of the lamphead 200 eliminates the need for reflector sleeves, thereby facilitating closer lamp-to-lamp spacing. In some embodiments, the lamp-to-lamp centerline distances may be reduced from 0.75 inches to 0.63 inches, thereby facilitating the use of more lamps, which increases power.

Each reflector cavity 204 may further include an inner surface coated with a light reflecting material. The light reflecting material may include any suitable light reflecting material, such as gold or a dielectric quarter-wave stack formed on top of a gold layer. The plurality of reflector cavities 204 and lamps 212 may be arranged in the monolithic member 202 in any desired pattern. The lamps may be arranged, for example, as described in U.S. Pat. No. 5,155,336. The number of lamps, as noted above, may vary. In some embodiments, the plurality of reflector cavities 204 may be arranged in parallel rows, wherein the reflector cavities in adjacent rows are staggered.

Each lamp receptacle 214 may be coupled to each reflector cavity 204 via each lamp passage 208. Each lamp receptacle 214 and each reflector cavity 204 may be disposed at opposing ends of each lamp passage 208. Each lamp passage 208 may be sized to accept a press seal (not shown) of a lamp 212. Alternatively, a lamp shrink seal may also be used or each lamp passage 208 may accommodate each lamp base. Light from each lamp 212 is directed toward the substrate 106 in the process chamber 100 through each reflector cavity 204.

Each lamp receptacle 214 is adapted to receive a lamp socket or a lampholder 216. Each lampholder 216 has an interface (not shown) that can receive lead pins 220 of the lamp 212. The lamp leads 220 are electrically connected via the interface to respective wires of wiring pairs 215, which provide power to the lamp 212. The lamp receptacles 214 may support the lamps 212 when the lamps 212 are plugged into the lamphead 200.

Figure 2A:
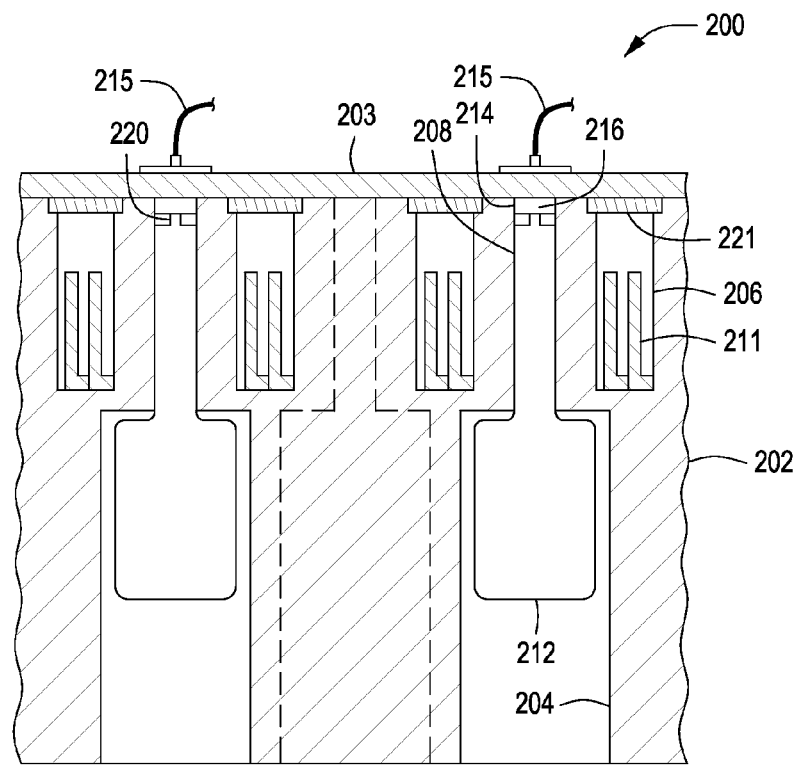
FIGS. 2A-B depict partial cross-sectional side views of a portion of a lamphead in accordance with some embodiments of the present invention.
Figure 2B:
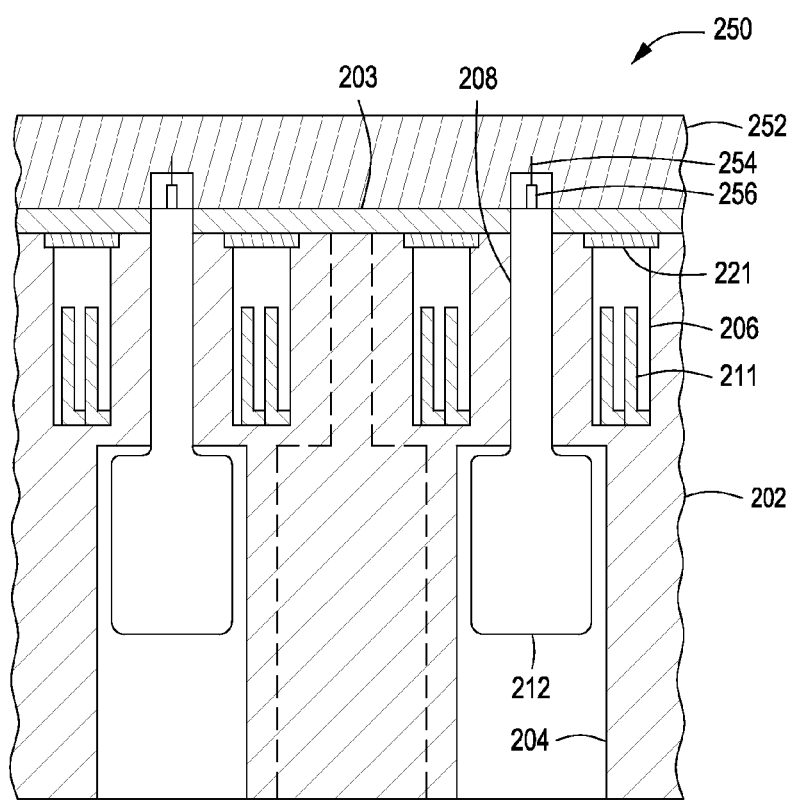

Each lamp 212 may have no base other than the press seal 210 or shrink seal 210 (not shown), depending on which one is used, although in other embodiments, the lamp may have a base (as illustrated in FIGS. 2A-2B). In some embodiments, each lamp lead 220 engages directly into each lampholder 216 to complete the electrical circuit. The outer lead or lamp seal can include features to enable a sound mechanical retention of the lamp, such as indents, which engage spring-loaded pins in the lampholder 216. A support plate 203 can be secured to the uppermost surface of the monolithic member 202 to hold each lampholder 216 within each lamp receptacle 214. The support plate 203 may facilitate limiting deformation (or bowing) of the monolithic member 202. The support plate 203 may be secured by epoxy, or other such materials having suitable thermal properties to function at temperatures in the lamphead 200. In some embodiments, the support plate 203 comprises stainless steel.

An alternative configuration of a lamphead 250 is illustrated in FIG. 2B. The lamphead 250 includes the monolithic member 202 having the plurality of coolant passages 206 and the plurality of lamp passages 208 and reflector cavities 204 formed therein, and at least one heat transfer member 211 extending from the monolithic member 202 into each coolant passage 206. The support plate 203 can be secured to the uppermost surface of the monolithic member 202 and a printed circuit board (PCB) 252 may be disposed above the support plate 203. The PCB 252 may be configured to provide power to each lamp 212. The PCB 252 comprises a plurality of connectors 254 disposed above each lamp passage 208, and capable of interfacing with each lamp 212 at the base to provide power to each lamp 212. The connectors 254 may comprise power lines, a plug which interfaces with the lamp pins of the lamp 212, or the like. Each connector 254 may be surrounded/covered with a flexible insulating plug 256. The plug 256 may insulate the connector 254 from, for example, shorting with the PCB 252. Further, the plug 256 may form a gas tight seal, for example, insulating the PCB 252 and connector 254 from any gas that may seep up through the reflector cavity 204 and lamp passage 208. A more detailed of a lamphead configured similarly to the lamphead 250 of FIG. 2B may be found in U.S. Pat. No. 6,350,964, issued, Feb. 26, 2002, and entitled "Power Distribution Printed Circuit Board for a Semiconductor Processing System," which is hereby incorporated by reference.

Returning to FIG. 2A, the plurality of coolant passages 206 are formed into the monolithic member 202 and disposed proximate to the plurality of reflector cavities 204. In some embodiments, a coolant passage 206 may be disposed on either side of each lamp 212. Each coolant passage 206 may have dimensions suitable for maximizing heat transfer between the monolithic member and a coolant fluid.

In some embodiments, and as illustrated in FIGS. 1-2, each coolant passage 206 may be a channel formed into a side (e.g., a top side) of the monolithic member 202 with a cap 221 disposed atop each channel. In some embodiments, the cap 221 may be coupled to the monolithic member 202. For example, the cap 221 may be coupled to the monolithic member 221 by gluing, soldering, or brazing with at least one of a solder or a eutectic alloy. The cap 221, the glue, the solder, or the eutectic alloy may be formed of materials having coefficients of thermal expansion substantially consistent with that of the materials forming the monolithic member, thereby limiting leakage of coolant fluids due to cyclical fatigue cracking of the seal between the cap and the monolithic member that may be caused by mismatched coefficients of thermal expansion.

The lamphead 200 further includes at least one heat transfer member 211. The at least one heat transfer member extends from the monolithic member 202 into each coolant passage 206. The at least one heat transfer member 211 may facilitate improved heat transfer between the monolithic member 202 and a coolant fluid disposed therein and flowing therethrough each coolant passage 206. The heat transfer member 211 may comprise the same materials as the monolithic member 202 or may be different. The heat transfer member 211 may comprise suitable materials compatible with and bondable to the materials forming the monolithic member 202 and compatible with the process (e.g., resistant to galvanic corrosion). The heat transfer member 211 may comprise suitable materials having a high thermal conductivity. In some embodiments, the at least one heat transfer member 211 may comprise at least one of stainless steel, copper, or aluminum. In some embodiments, the materials comprising the at least one heat transfer member 211 have thermal conductivity between about 10-1000 W/mK.

Although illustrated in FIGS. 1-2 as extending about half of the height of each coolant passage 206, each heat transfer member 211 can extend other distances, such as lesser distances and greater distances including up to the full height of each coolant passage 206. The heat transfer member 211 may integrally formed with the monolithic member 202 (for example, machined into the monolithic member 202), or as illustrated in FIGS. 1-2, the heat transfer member 211 may be a separate component that is attached to the monolithic member 202 at a base of each coolant passage 206.

In some embodiments, and as illustrated in FIGS. 1-2, the heat transfer member 211 may have a wider cross section at the base of each coolant passage 206 to facilitate robust coupling thereto, improved stability, and/or improved thermal conduction between the monolithic member 202 and the heat transfer member 211. In embodiments wherein the heat transfer member 211 is a separate component, the heat transfer member 211 may be coupled to the base of each coolant passage 206 in a suitable manner, such as by gluing, welding, ultrasonic welding, explosive welding, brazing, interference fitting, or the like. In some embodiments, the heat transfer member 211 may be coupled to the base of each coolant passage 206 by brazing using a solder, a eutectic alloy, or the like. In some embodiments, the heat transfer member 211 may be coupled to the base of each coolant passage 206 using a eutectic foil to facilitate coupling with little or no air voids disposed therebetween, thereby enhancing robust thermal coupling between the monolithic member 202 and the heat transfer member 211. In some embodiments, the heat transfer member 211 may be coupled to the base of each coolant passage 206 using an adhesive.

The materials forming the monolithic member 202, the solder or eutectic alloy, and the at least one heat transfer member 211 may have substantially similar coefficients of thermal expansion such that a joint formed between the heat transfer member 211 and the base of the coolant passage 206 via brazing will be resistant to cyclic fatigue cracking brought on by rapid heating and cooling of the joint. In embodiments wherein the heat transfer member 211 extends the full height of the coolant passage 206, the heat transfer member 211 can have a cross section similar to that described above for the base and may be adhered to the cap 211 by similar methods.

The heat transfer member 211 may be spaced apart from the sidewalls of the coolant passage 206, or to other heat transfer members 211 within the same coolant passage 206 by any suitable distance that maintains suitable flow of the heat transfer fluid therebetween. In some embodiments, the heat transfer member 211 may be spaced apart from the sidewalls of the coolant passage 206 by about 1 mm. Of course, the spacing may vary depending upon the size of the coolant passage, and the size and number of the heat transfer members disposed therein.

The heat transfer member 211 may extend the length of the coolant passage 206 for a distance at least sufficient to be disposed adjacent the lamps 212. The heat transfer member 211 may have a longitudinal profile (e.g., along the length of the coolant passage 206) that is straight, angled, wavy, or the like. For example, as illustrated FIG. 3A, the heat transfer member 211 may further comprise at least one fin having a linear profile (e.g., fin 301), a sinusoidal profile (e.g., fin 303), or other suitable profile. In some embodiments, a non-linear profile, such as the sinusoidal profile, may facilitate improved heat transfer between the surface of the fin and a coolant fluid flowing therethrough the coolant passage 206, for example, by minimizing the boundary layer of the coolant fluid proximate the surface of the fin, and thus improving the heat transfer therebetween.

Figure 3A:
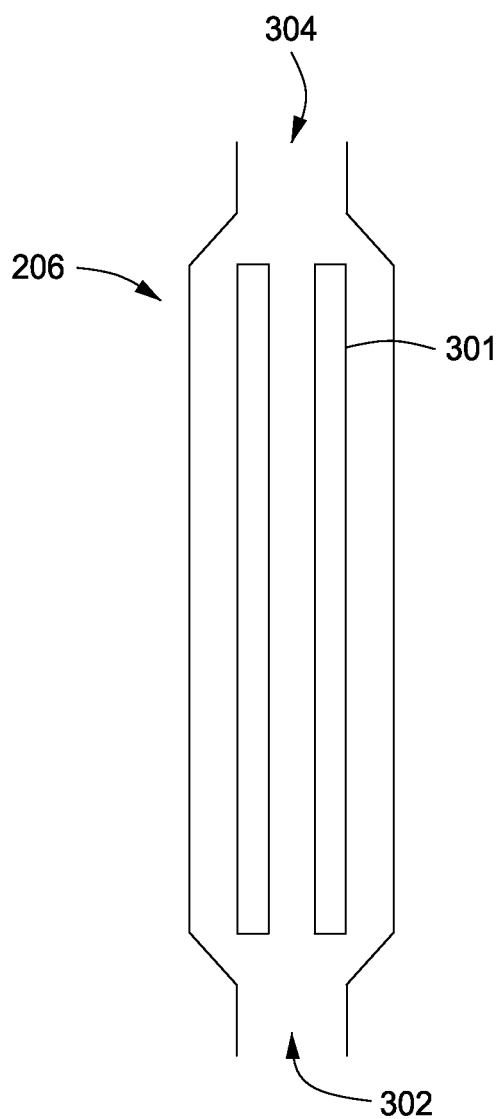
FIGS. 3A-3B depict exemplary coolant passage configurations in accordance with some embodiments of the present invention.
Figure 3B:
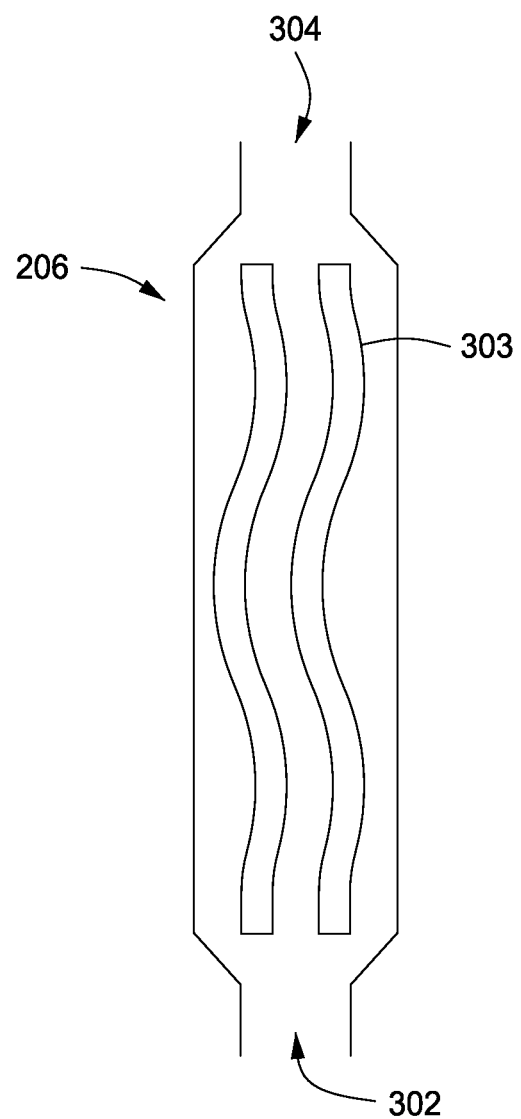

In some embodiments, and as illustrated in FIG. 3A-B, the at least one heat transfer member 211 may comprise a plurality of fins 301 (as shown in FIG. 3A), or a plurality of fins 303 (as shown in FIG. 3B). In some embodiments, the plurality of fins 301 or 303 comprise two fins having a longitudinal axis substantially parallel to the longitudinal axis of the coolant passage 206. In some embodiments, each fin in the plurality is substantially parallel to an adjacent fin in the plurality. For example, fins 301 (303) is considered to be substantially parallel to an adjacent fin 301 (303). Although two fins are shown in the Figures, any suitable number of fins may be provided and the spacing between each fin may be utilized to facilitate improved heat transfer between each fin and the heat transfer fluid. The profiles of the heat transfer members disclosed herein are exemplary and may have other geometries while still providing the benefits disclosed herein.

Figure 4A:
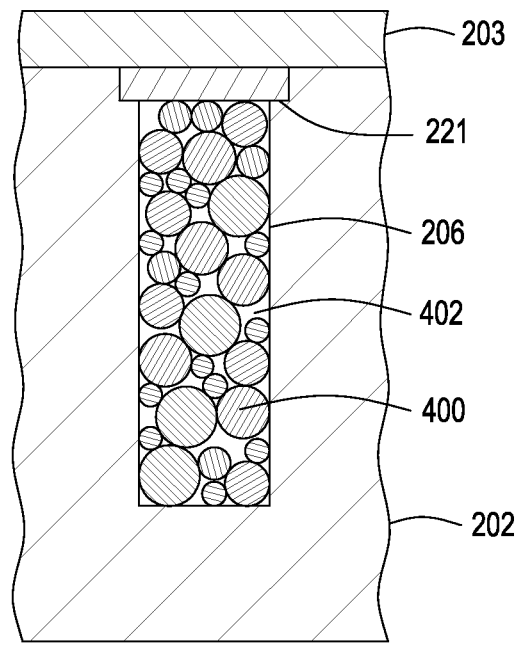
FIGS. 4A-B depict exemplary coolant passage configurations in accordance with some embodiments of the present invention.

Although shown above as fins, or fin-like structures, the at least one heat transfer member 211 may have a variety of other forms as well. For example, alternative, non-limiting embodiments of the at least one heat transfer member 211 are described below with respect to FIGS. 4-5. As illustrated in FIG. 4A, the at least one heat transfer member may comprise a plurality of solid bodies 400 disposed within each coolant passage 206. The solid bodies 400 may be spherical, as shown, or may have any other shapes (regular or irregular). The solid bodies 400 may further be of the same size or of different sizes. Each body 400 may be pressed against or bonded to an adjacent body and/or to the walls of the coolant passage 206 to facilitate robust heat transfer between the coolant passage 206 and bodies 400. A coolant fluid may flow through the coolant passage 206 between interstitial spaces 402 formed between the bodies 400.

Figure 4B:
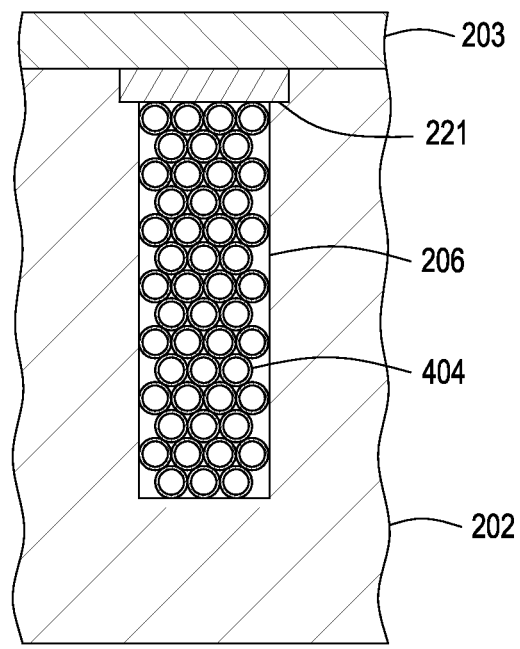

Alternatively, as depicted in FIG. 4B, the at least one heat transfer member may be a plurality of tubes 404 extending along the coolant passage 206 for flowing a coolant fluid therethrough. The plurality of tubes 404 may be pressed together, brazed together, or otherwise bonded for good thermal contact. The tubes 404 may be substantially parallel and aligned with the longitudinal axis of the coolant passage 206. The tubes 404 may also be stacked in an ordered pattern as shown to maximize contact area between the tubes and each other and between the tubes and the walls of the coolant passage 206. Any suitable stacking pattern and tube configuration may be utilized that provides sufficient heat transfer between the coolant passage 206 and a coolant fluid flowing through the tubes 404. In some embodiments, interstitial spaces 406 between each tube 404 may be filled with a suitable material that improves thermal contact between adjacent tubes 404, such as the material used for brazing or bonding the tubes 404 together.

Figure 5A:
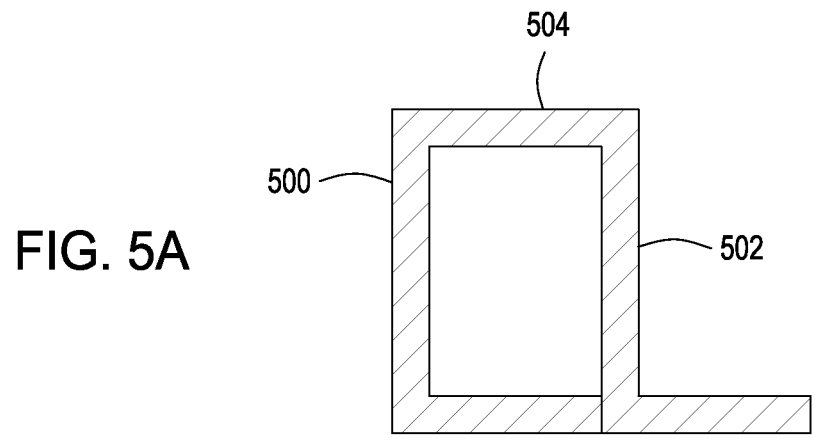
FIG. 5A-C depict exemplary coolant fin configurations in accordance with some embodiments of the present invention.
Figure 5B:
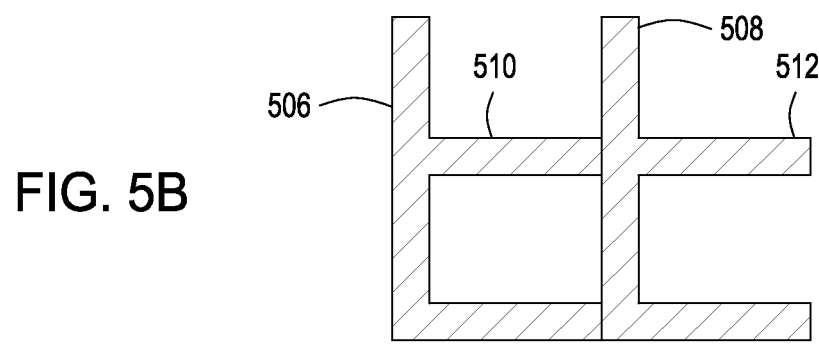
Figure 5C:
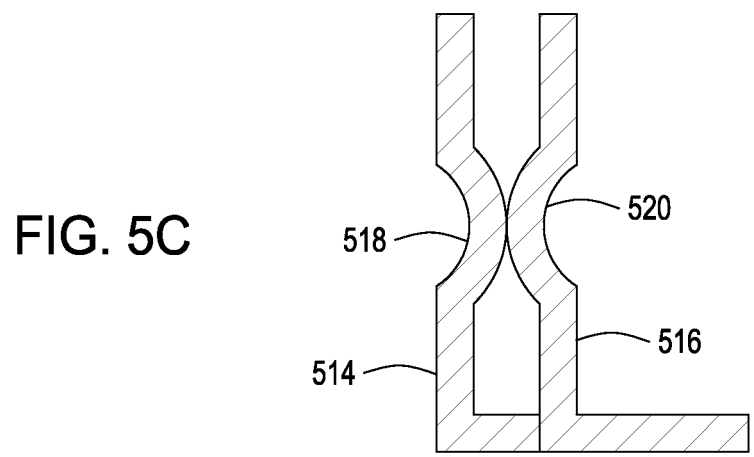

In embodiments where the at least one heat transfer member 211 is a fin, or fin-like member (e.g., as depicted in FIGS. 2A-B and 3A-B), features may be added to each member to preserve the gap between adjacent heat transfer members and, optionally, between heat transfer members and the sidewalls of the coolant passage 206. Such features may include dimples, bumps, bonded shapes, bends in the member, or the like. For example, as illustrated in FIG. 5A, in some embodiments, adjacent heat transfer members (e.g., 500, 502) are formed of one-piece construction such that a beam 504 is formed between the heat transfer members 500, 502. In some embodiments, as illustrated in FIG. 5B, adjacent heat transfer members (e.g., 506, 508) are formed individually include one or more horizontal elements 510, 512 separating adjacent heat transfer members. Although shown as formed on each heat transfer member 506, 508, the horizontal element may be provided solely between adjacent heat transfer members. In some embodiments, as illustrated in FIG. 5C, one or more of adjacent heat transfer members (e.g., 514, 516) may include one or more features (e.g., 518, 520) disposed in a vertical portion of the heat transfer member for facilitating separation therebetween. Such features may be a dimple or protrusion formed in the heat transfer member, or a separate component that may be bonded to the heat transfer member to form the protrusion. As illustrated in FIG. 5C, such features 518, 520 on adjacent heat transfer members 514, 516 can oppose each other thus facilitating separation of the adjacent heat transfer members. Other geometries and configurations of the heat transfer members and separation features may be satisfactorily utilized to maintain a desired spacing between adjacent heat transfer members (and, optionally, between heat transfer members and the sidewalls of the coolant passage).

In some embodiments, the coolant passage 206 and/or the at least one heat transfer member 211 may be coated, or clad, with materials that may facilitate limiting the erosion and/or corrosion of the coolant passage 206 and/or the at least one heat transfer member 211. Such materials may include polymeric coatings, electroless deposited nickel, a stainless steel layer hydrostatically pressed or brazed into the coolant passage 206, a thin stainless steel tubing having the coolant passage formed thereabout, diamond-like carbon coatings, or the like.

In operation, and referring to FIGS. 1 and 2A-B, heat transfer fluid enters the monolithic member 202, and ultimately, the coolant passages 206, via an inlet 154, and exits via an outlet 156. In some embodiments, the heat transfer fluid may contain little or no dissolved oxygen or oxidizing agents contained therein, thereby limiting erosion and/or corrosion of the coolant passage 206 and/or the at least one heat transfer member 211 contained therein. In some embodiments, the heat transfer fluid contains less than about 0.1 ppm oxygen equivalent of oxidizing agents. Water with reduced dissolved oxygen may be obtained by vacuum degassing, boiling, membrane filtration, and nitrogen sparging. In some embodiments, the heat transfer fluid may include reducing agents, such as tannis, hydrazine, hydroquinone/progallol-based derivatives, hydroxylamine derivatives, ascorbic acid derivatives, and other materials generally known in the boiler water treatment industry. The heat transfer fluid may be part of a closed loop, wherein the heat transfer fluid exiting the outlet 156 is cooled and reintroduced to the inlet 154. Alternatively, new heat transfer fluid may be delivered to the inlet 154 continuously or mixed with recycled heat transfer fluid.

The inlet 154 and the outlet 156 are fluidly coupled to each other via the plurality of coolant passages 206. In addition, as illustrated in FIG. 3, each coolant passage 206 comprises an inlet 302 (coupled to the inlet 154 shown in FIG. 1) and an outlet 304 (coupled to the outlet 156 shown in FIG. 1). The heat transfer fluid enters each coolant passage 206 via the inlet 302 and exits each coolant passage via the outlet 304. The inlets 302 and outlets 304 of the coolant passages 206 on each side of the plurality of lamps 212 may be respectively grouped into inlet and outlet plena (not shown) that are coupled to the inlet 154 and the outlet 156 of the lamphead to facilitate flowing the heat transfer fluid therethrough. The coolant passages 206 may be arranged in a parallel flow configuration such that heat transfer fluid enters each inlet 302 and exits each outlet 304 in a controlled fashion, thus facilitating uniform heat transfer in the monolithic member 202. For example, the flow in each coolant passage 206 may be controlled by respective orifices or by flow controllers (not shown) coupled to one or more coolant passages.

The flow rate of heat transfer fluid may be any suitable flow rate for controlling the heat transfer between the surface of the heat transfer members 211 (e.g., the fins 301, 303) and the heat transfer fluid flowing through the coolant passage 206. In some embodiments, the flow rate is about 2 to about 3 meters per second. In some embodiments, the flow rate facilitates a laminar flow regime, which may facilitate a lower pressure drop across each coolant passage, thus requiring less energy for flow therethrough, and may minimize erosion and corrosion of the at least one heat transfer member 211 (e.g., the fins 301, 303) caused by turbulent flow. Thus, a laminar flow regime facilitates an improved temperature gradient between the surface of the at least one heat transfer member 211 (e.g., the fins 301, 303) and the heat transfer fluid, thereby improving heat transfer therebetween, while minimizing turbulence and minimizing the pressure drop across the coolant passage. The flow rate may be adjusted to facilitate laminar flow through each coolant passage 206 based on the configuration of the at least one heat transfer member 211 disposed therein. For example, the flow rate may be adjusted based on factors including the number of heat transfer members 211, the spacing between each heat transfer member 211, the profile of each heat transfer member 211, and the like.

In some embodiments, laminar flow may be desirable in embodiments of heat transfer members 211 having sinusoidal profiles (for example, fins 303). For example, the heat transfer fluid may include impurities such as oxygen, which may react with the heat transfer member 211 via, for example, a turbulent flow of the heat transfer fluid proximate a bend in the sinusoidal profile. This reaction may form, for example, a metal oxide on the surface of the heat transfer member 211, which may undesirably facilitate at least one of reduced heat transfer between the surface of the heat transfer member 211 and the heat transfer fluid, or erosion of the heat transfer member 211 due to loss of material via the metal oxide formation and removal.

Thus, embodiments of a lamphead and apparatus for processing a substrate have been provided herein. The lamphead includes a monolithic member having a plurality of coolant passages disposed therein and least one heat transfer member extending from the monolithic member into each coolant passage. The at least one heat transfer member disposed in each coolant passage may advantageously facilitate the rapid cooling of the monolithic member during a rapid thermal process (RTP), and may limit cyclical fatigue cracking in the coolant passages.

While the foregoing is directed to embodiments of the present invention, other and further embodiments of the invention may be devised without departing from the basic scope thereof.

The invention claimed is:

1. A lamphead for use in thermal processing, comprising:
a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and
at least one heat transfer member extending from the monolithic member into each coolant passage, wherein the at least one heat transfer member extends into each coolant passage up to the full height of each coolant passage.

2. The lamphead of claim 1, wherein the at least one heat transfer member is integrally formed in the monolithic member.

3. The lamphead of claim 1, wherein the at least one heat transfer member extends into each coolant passage the full height of each coolant passage.

4. The lamphead of claim 1, wherein each coolant passage further comprises:
a channel formed into a side of the monolithic member; and
a cap disposed atop each channel such that the cap and the channel together form the coolant passage.

5. The lamphead of claim 4, further comprising a support plate disposed over the monolithic member and each cap.

6. The lamphead of claim 4, wherein the cap is coupled to the monolithic member using at least one of gluing, soldering, or brazing with a solder or a eutectic alloy.

7. The lamphead of claim 1, wherein the monolithic member comprises at least one of stainless steel, copper, or aluminum.

8. The lamphead of claim 1, wherein each coolant passage further comprises an inlet and an outlet having the at least one heat transfer member disposed therebetween.

9. The lamphead of claim 1, wherein the at least one heat transfer member includes at least one fin having a longitudinal profile that is linear or sinusoidal.

10. The lamphead of claim 1, wherein a longitudinal axis of the at least one heat transfer member is substantially parallel to a longitudinal axis of the coolant passage.

11. The lamphead of claim 1, wherein the plurality of coolant passages, the at least one heat transfer member, or combinations thereof, are covered with a material that is resistant to erosion and/or corrosion.

12. The lamphead of claim 11, wherein the material comprises at least one of electroless nickel, a polymer, diamond-like carbon, or stainless steel.

13. The lamphead of claim 1, further comprising:
a heat transfer fluid source to provide a heat transfer fluid to the lamphead, wherein the heat transfer fluid contains less than about 0.1 ppm oxygen equivalent of oxidizing agents.

14. The lamphead of claim 13, wherein the heat transfer fluid further comprises reducing agents disposed therein.

15. The lamphead of claim 14, wherein the reducing agents comprise at least one of tannis, hydrazine, hydroquinone/progallol-based derivatives, hydroxylamine derivatives, or ascorbic acid derivatives.

16. The lamphead of claim 1, further comprising:
a support plate coupled to the monolithic member; and
a printed circuit board disposed adjacent the support plate and configured to be coupled to a plurality of lamps corresponding to the plurality of lamp passages formed in the monolithic member.

17. A lamphead for use in thermal processing, comprising:
a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and
at least one heat transfer member extending from the monolithic member into each coolant passage, wherein the at least one heat transfer member is integrally formed in the monolithic member and extends into each coolant passage the full height of each coolant passage.

18. An apparatus for use in thermal processing, comprising:
a process chamber having a substrate support; and
a lamphead positioned to provide energy to the substrate support, the lamphead comprising:
a monolithic member having a plurality of coolant passages and a plurality of lamp passages and reflector cavities, wherein each lamp passage is configured to accommodate a lamp and each reflector cavity is shaped to act as a reflector or to receive a replaceable reflector for the lamp, and wherein the plurality of coolant passages are disposed proximate to the plurality of lamp passages; and
at least one heat transfer member extending from the monolithic member into each coolant passage, wherein the at least one heat transfer member extends into each coolant passage up to the full height of each coolant passage.

19. The lamphead of claim 18, wherein the at least one heat transfer member is integrally formed in the monolithic member and extends into each coolant passage the full height of each coolant passage.

20. The lamphead of claim 18, further comprising:
a heat transfer fluid source coupled to the plurality of coolant passages to provide a heat transfer fluid to the lamphead, wherein the heat transfer fluid contains less than about 0.1 ppm oxygen equivalent of oxidizing agents.

* * * * *